United States Patent
Lin et al.

(10) Patent No.: US 6,819,620 B2
(45) Date of Patent: Nov. 16, 2004

(54) POWER SUPPLY DEVICE WITH REDUCED POWER CONSUMPTION

(75) Inventors: Yen-Tai Lin, Hsin-Chu (TW); Ching-Yuan Lin, Hsin-Chu Hsien (TW); Chien-Hung Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/248,495

(22) Filed: Jan. 23, 2003

(65) Prior Publication Data

US 2004/0145931 A1 Jul. 29, 2004

(51) Int. Cl.⁷ .............................................. G11C 11/34
(52) U.S. Cl. .................. 365/227; 365/185.23; 365/226
(58) Field of Search ..................... 363/147; 365/185.18, 365/185.23, 185.27, 226, 227, 228, 230.06, 230.09

(56) References Cited

U.S. PATENT DOCUMENTS 5,956,283 A * 9/1999 Park ........................... 365/226
6,002,630 A * 12/1999 Chuang et al. .............. 365/226
6,191,976 B1 * 2/2001 Smayling et al. ......... 365/185.2
6,255,900 B1 * 7/2001 Chang et al. ................ 327/589
6,603,702 B2 * 8/2003 Kojima ................... 365/230.06

FOREIGN PATENT DOCUMENTS

TW          225602          6/1994

* cited by examiner

Primary Examiner—Matthew V. Nguyen
(74) Attorney, Agent, or Firm—Winston Hsu

(57) ABSTRACT

A power supply used for providing a flash memory with an operating voltage has a plurality of memory blocks and a plurality of decoders corresponding to the memory blocks. Each memory block has a plurality of memory cells for storing binary data. Each decoder is used for selecting memory cells in the corresponding memory block. The power supply has at least three power sources for generating different voltages, and controls the power sources for making a voltage difference between a high voltage level and a low voltage level of the unselected decoder less than a voltage difference between a high voltage level and a low voltage level of the selected decoder.

7 Claims, 4 Drawing Sheets

US 6,819,620 B2

POWER SUPPLY DEVICE WITH REDUCED POWER CONSUMPTION

BACKGROUND OF INVENTION

1. Field of the Invention

The present invention relates to a power supply device for a flash memory, and more particularly, to a power supply device with reduced power consumption.

2. Description of the Prior Art

Recently, flash memory technology has quickly developed owing to a great demand for portable electric products. The flash memory related market is also further advancing associated research into flash memory devices. The portable electric products include digital cameras, cellular phones, video game apparatuses, personal digital assistants, electric recorders, and programmable ICs. For example, digital cameras need the flash memory to replace traditional film, and cellular phones, video game apparatuses, personal digital assistants, electric recorders, and programmable ICs require the flash memory to store data or programs.

The flash memory is a non-volatile memory. That is, the flash memory records data through changing a threshold voltage of a transistor or a memory cell to control a gate channel induced at the transistor or the memory cell. The data stored in the flash memory, therefore, will not be cleared or lost even though a corresponding operating voltage of the flash memory is turned off. The flash memory is viewed as a special structure of an electrically erasable and programmable read only memory (EEPROM). In other words, the flash memory alters the number of electrons stored on a floating gate to affect the corresponding threshold voltage. For the sake of programming the EEPROM, a Flowler-Nordheim tunneling mechanism or a hot electron injection mechanism, generally speaking, is used to control the number of electrons stored on the floating gate. Therefore, if the number of electrons is decreased, the corresponding threshold voltage is lowered. The binary value "0" is accordingly recorded by the flash memory. On the other hand, if the number of electrons is increased, the corresponding threshold voltage is raised. The binary value "1" is accordingly recorded by the flash memory.

Please refer to FIG. 1, which is a schematic diagram of a prior art flash memory device 10. The flash memory device 10 has a controller 11, a memory 12, a sense amplifier 14, a page buffer 16, a driving circuit 18, and a power supply device 20. The controller 11 is used to output a control signal to control operation of the flash memory device 10. The memory 12 has a plurality of memory blocks 22 wherein each memory block 22 has a plurality of memory cells 24. The memory cells 24 are arranged in a matrix format for individually storing binary values. In addition, each memory block 22 has a plurality of transistors 25. The memory cell 24 is accessed when the corresponding transistor 25 is turned on. The memory cell 24, as mentioned above, records one binary value "1" or "0" according to the number of electrons stored on the floating gate. When a driving voltage is applied to the memory cell 24 for turning on the memory cell 24, the driving voltage has to overcome the threshold voltage that is affected by the number of electrons stored on the floating gate. That is, the number of electrons stored on the floating gate will accordingly affect an output current passing through the memory cell 24. The sense amplifier 14 is electrically connected to the controller 11 for reading the binary value recorded by the memory cell 24 when receiving the control signal generated from the controller 11. The sense amplifier 14 is capable of precisely determining the binary value recorded by the memory cell 24 according to either the voltage or the current outputted from the memory cell 24. The page buffer 16 is electrically connected to the controller 11, and is capable of driving the memory cells 24 to perform a writing operation so as to store the binary values. The driving circuit 18 has a plurality of decoders 28 for locating the memory cells of the memory block 22 according to the control signal generated from the controller 11. Each decoder 28 corresponds to one of the memory blocks 22 of the memory 12. For example, the decoder 28a corresponds to the memory block 22a, and the decoder 28b corresponds to the memory block 22b. The decoder 28 includes a plurality of word line drivers 30 individually electrically connected to memory cells 24 that are positioned at the same row in the memory block 22, and a select gate driver electrically connected to memory cells that are positioned at different columns of the memory block 22. Therefore, the word line driver 30 and the select gate driver 32 select one memory cell 24 out of the memory block 22. In addition, the power supply device 20 is used to provide each decoder 28 with appropriate operating voltages, for example, the driving voltages required to turn on the transistors 25 and the memory cells 24.

Please refer to FIG. 2 in conjunction with FIG. 3. FIG. 2 is a schematic diagram of the power supply device 20 shown in FIG. 1, and FIG. 3 is schematic diagram of the word line driver 30 shown in FIG. 1. The power supply device 20 includes a plurality of voltage sources 34 for providing different output voltages, and a switch 36 for selecting the output voltages and outputting the selected output voltages from corresponding output terminals A, B, C, D to the driving circuit 18 so as to providing each decoder 28 with the appropriate operating voltages. For instance, if the voltage sources 34a, 34b, 34c, 34d, 34e respectively generate 7 volts, 3 volts, 1.5 volts, 0 volts, −10 volts, when the decoder 28a processes the memory block 22a according to the control signal of the controller 11, each word line driver 30 needs a first driving voltage (0 volts) or a second driving voltage (−10 volts) to control access of memory cells positioned at the same word line in the memory block 22a. Therefore, the voltage source 34e outputs 10 volts from the output terminal C to word line drivers 30 of the decoder 28a with the help of the switch 36, and the voltage source 34d outputs 0 volts from the output terminal D to other word line drivers 30 of the decoder 28a with the help of the switch 36. The target word line is then selected, and the memory cells 24 located at the selected word line are capable of being accessed. As shown in FIG. 3, the word line driver 30 can be fabricated by a complementary metal oxide semiconductor (CMOS) transistor process. That is, the word line driver 30 has a plurality of CMOS transistors 38. The CMOS transistor 38 has a p-channel metal oxide semiconductor (PMOS) transistor 40 electrically connected to the first driving voltage and an n-channel metal oxide semiconductor (NMOS) transistor 42 electrically connected to the second driving voltage. Please note that only one transistor 38 is shown in FIG. 3 for simplicity. The driving circuit 18 generates a selecting signal according to the control signal outputted from the controller 11. The selecting signal is used to control operation of word line drivers 30 and the select gate driver 32 of each decoder 28. If the controller 11 intends to access the memory cells 24 of the memory block 22a, the driving circuit 18 will input the selecting signal to the decoder 28a after receiving the control signal of the controller 11. Then, the memory block 22a operates under a selected mode. In the meanwhile, another decoder 28b will not receive the selecting signal so that the corresponding memory block 22b operates under an unselected mode. Therefore, the decoder 28a is capable of controlling the word line driver 30 to access memory cells 24 located at each word line of the memory block 22a. When the memory cells 24 positioned at the word line N are accessed, the selecting signal keeps the transistor 40 off and turns on the transistor 42. Therefore, the word line N will approach the second driving voltage (−10 volts) so that each memory cell 24 positioned at the word line N is turned on to be further accessed. On the contrary, the memory cells 24 positioned at other word lines are kept off. The selecting signal turns on the transistor 40 so that other word lines approach the first driving voltage (0 volts) without turning on corresponding memory cells 24. Similarly, the memory cells 24 in the memory block 22b operating under the unselected mode are kept off, that is, there is no selecting signal inputted to the decoder 28b for actuating the word line drivers 30. The memory cells 24 in the memory block 22b cannot be accessed. The operation and circuit structure of the select gate driver 32 is similar to the word line driver 30. The select gate driver 32 uses the selecting signal, a third driving voltage (7 volts) at the output terminal A, and a fourth driving voltage (0 volts) at the output terminal B to control operation of transistors 25 located at each bit line. The similar description related to operation of the select gate driver 32 is not repeated for brevity.

As mentioned above, when the memory block 22a operating under the selected mode is accessed, the power supply device 20 will output the first and second driving voltages to the word line drivers 30 of the decoder 28a. With regard to the memory block 22b operating under the unselected mode, the word line drivers 30 of the decoder 28b will also receive the first and second driving voltages generated from the power supply device 20 though the decoder 28b does not receive the selecting signal corresponding to the control signal of the controller 11. In other words, the transistors 40, 42 of each word line driver 30 in the decoder 28b are kept off. However, the first and second driving voltages are continuously inputted to the transistor 38 of each word line driver 30 in the decoder 28b. Therefore, the transistor 38 will have a reverse bias. For example, the reverse bias between the source and the substrate of the transistor 40 will induce junction leakage with undesired power consumption. Similarly, with regard to the select gate driver 32 in the memory block operating under the unselected mode, the junction leakage is induced because of the reverse bias generated by the third and fourth driving voltages. When the driving circuit 18 is driven by a fixed operating voltage to have a limited current capacity, the junction leakage induced by the reverse bias in the decoder 28b accordingly reduces the actual current outputted from the decoder 28a to drive the memory cells 24 located at the corresponding word line. Therefore, the driving efficiency of the decoder 28a is greatly deteriorated. In addition, the power consumption of the power supply device 20 is then increased owing to the undesired power consumption induced by the junction leakage.

SUMMARY OF THE INVENTION

It is therefore a primary objective of the claimed invention to provide a power supply device with reduced power consumption to solve the above-mentioned problems.

According to the claimed invention, a power supply device of a flash memory provides the flash memory with an operating voltage. The flash memory has a plurality of memory blocks and a plurality of decoders corresponding to the memory blocks. Each memory block has a plurality of memory cells for storing binary data. Each decoder is used for selecting the memory cells out of the corresponding memory block. The power supply device has at least three voltage sources electrically connected to each decoder for outputting a plurality of voltages wherein the power supply device controls the voltage sources so that a voltage difference between a high voltage level and a low voltage level of an unselected mode for the decoders is less than a voltage difference between a high voltage level and a low voltage level of a selected mode for the decoders.

It is an advantage of the claimed invention that the claimed power supply device uses a plurality of switches for selectively outputting appropriate operating voltages to each decoder. Therefore, the voltage difference between a high driving voltage level and a low driving voltage level of decoders corresponding to the memory blocks operating under the unselected mode is smaller than that of decoders corresponding the memory blocks operating under the selected mode. The leakage current generated from the decoders corresponding to the memory blocks operating under the unselected mode is greatly reduced so that the undesired power consumption is lowered and the driving efficiency related to the decoders corresponding to the memory blocks operating under the unselected mode is improved.

These and other objectives of the claimed invention will no doubt become obvious to those of ordinary skill in the art after reading the following detailed description of the preferred embodiment that is illustrated in the various figures and drawings.

DETAILED DESCRIPTION

Figure 4:
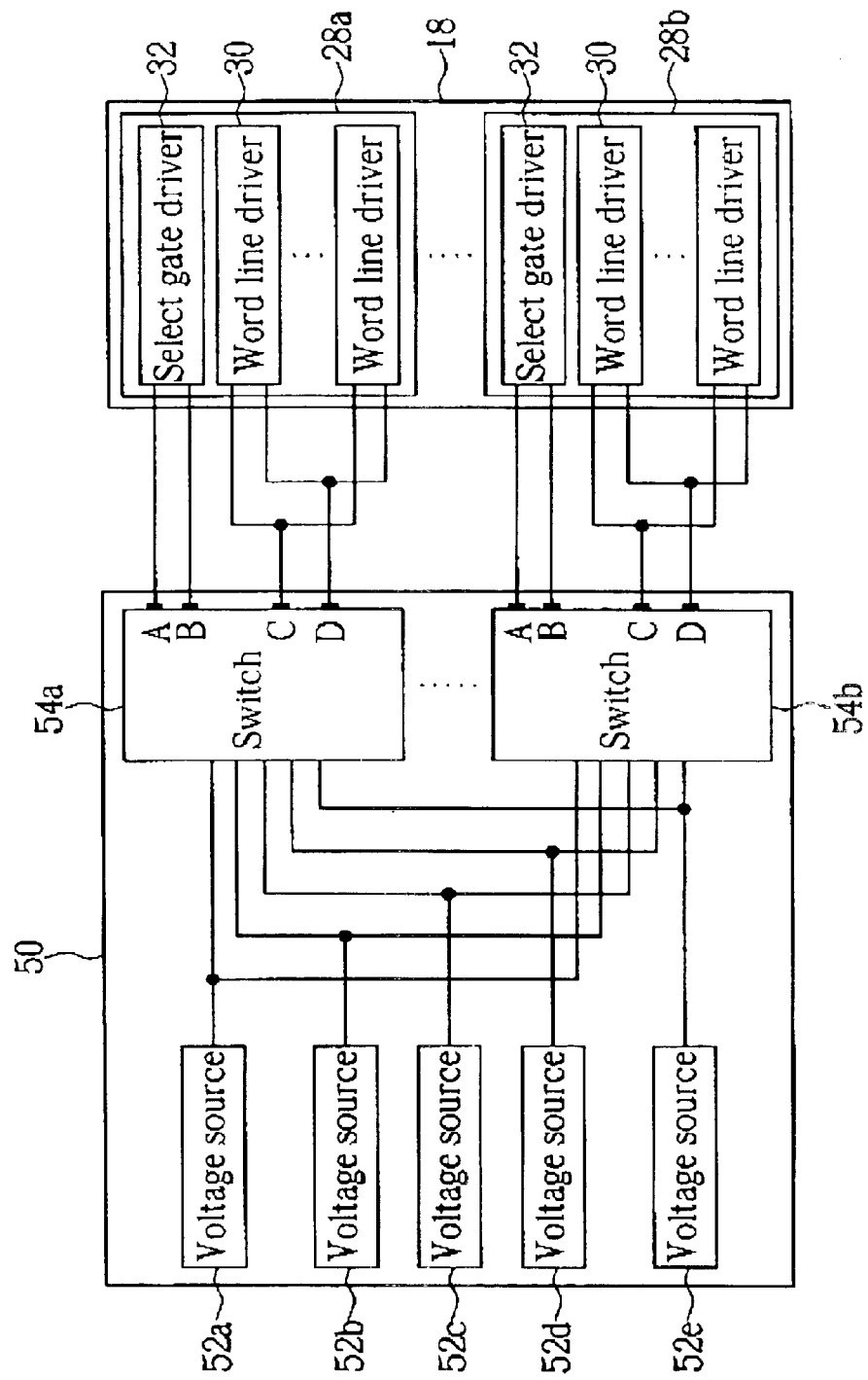
FIG. 4 is a schematic diagram of a power supply device according to the present invention.

Please refer to FIG. 4, which is a schematic diagram of a power supply device 50 according to the present invention. The power supply device 50 has a plurality of voltage sources 52 for providing different output voltages, and a plurality of switches 54 for selecting the output voltages generated from the voltage sources 52 and outputting the selected output voltages from output terminals A, B, C, D to the driving circuit 18 so as to provide each decoder 28 with an appropriate operating voltage. Each voltage source is electrically connected to each of die switches 54, and each switch 54 is electrically connected to a corresponding decoder 28. For example, the switch 54a is connected to the decoder 28a, and the switch 54b is connected to the decoder 28b. Operation of the power supply device 50 according to the present invention is described as follows. If the voltage sources 52a, 52b, 52c, 52d, 52e respectively output 7 volts, 3 volts, 1.5 volts, 0 volts, −10 volts. When the decoder 28a processes a corresponding memory block 22a according to the control signal outputted from the controller 11, each word line driver 30 needs a first driving voltage (0 volts) or a second driving voltage (−10 volts) to control access of memory cells 24 located at each word line in the memory block 22a. Therefore, the voltage source 52e outputs −10 volts from the output terminal C to the word line driver 30 with the help of the switch 54a, and the voltage source 52d outputs 0 volts from the output terminal D to the word line driver 30 with the help of the switch 54a. In addition, the select gate driver 32 needs a third driving voltage (7 volts) and a fourth driving voltage (0 volts) to control data access of memory cells 24 located at each bit line. Therefore, the voltage source 52a outputs 7 volts from the output terminal A to the select gate driver 32 with the help of the switch 54a, and the voltage source 52d outputs 0 volts from the output terminal to the select gate driver 32 with the help of the switch 54a. With regard to die memory block 28b operating under the unselected mode, the voltage source 52c outputs 1.5 volts from the output terminal C to the word line driver 30 with the help of the switch 54b, the voltage source 52d outputs 0 volts from the output terminal D to the word line driver 30 with the help of the switch 54b, the voltage source 52b outputs 3 volts from the output terminal A to the select gate driver 32 with the help of the switch 54b, and the voltage source 52d outputs 0 volts from the output terminal B to the select gate driver 32 with the help of the switch 54b.

Figure 1:
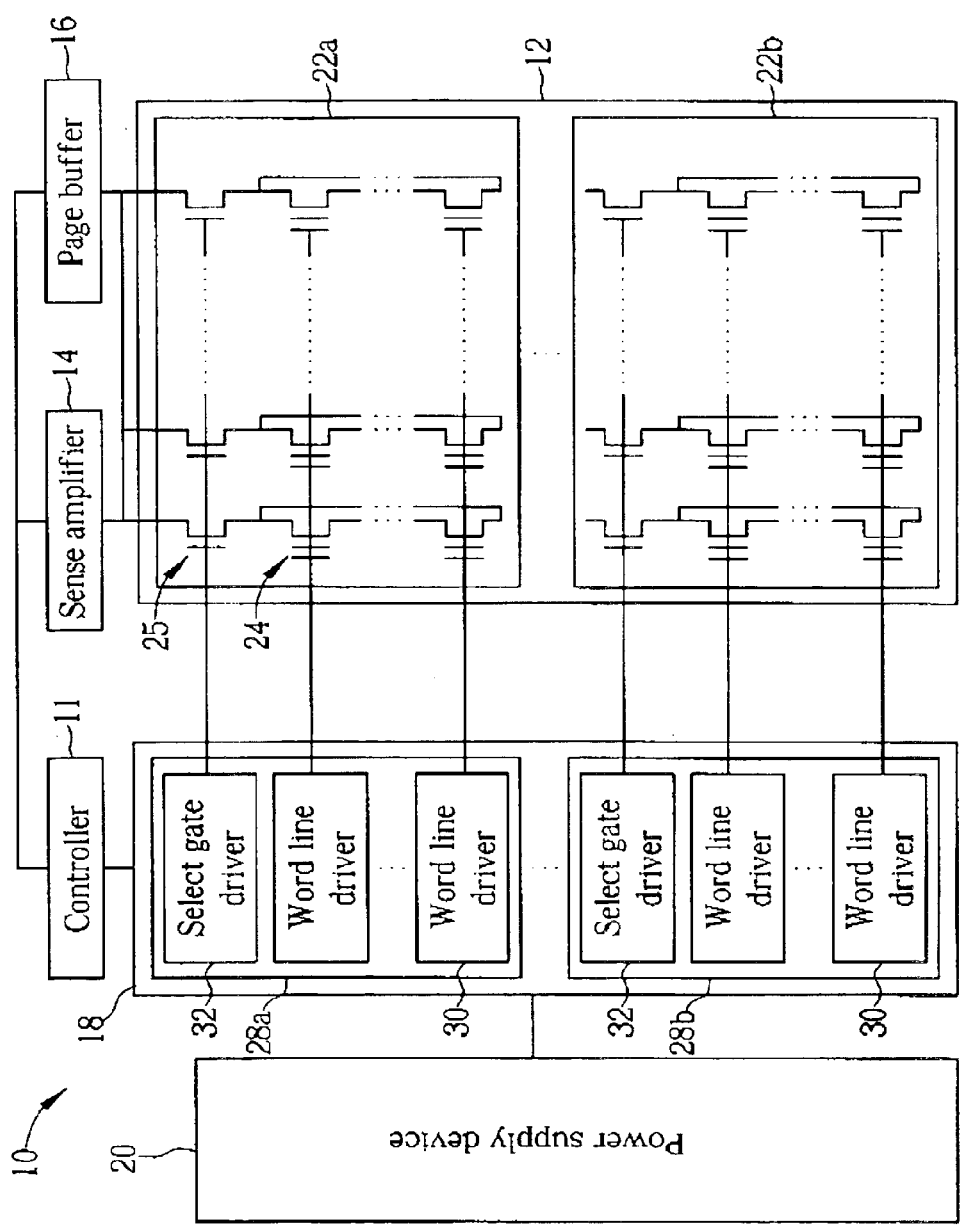
FIG. 1 is a schematic diagram of a prior art flash memory device.
Figure 2:
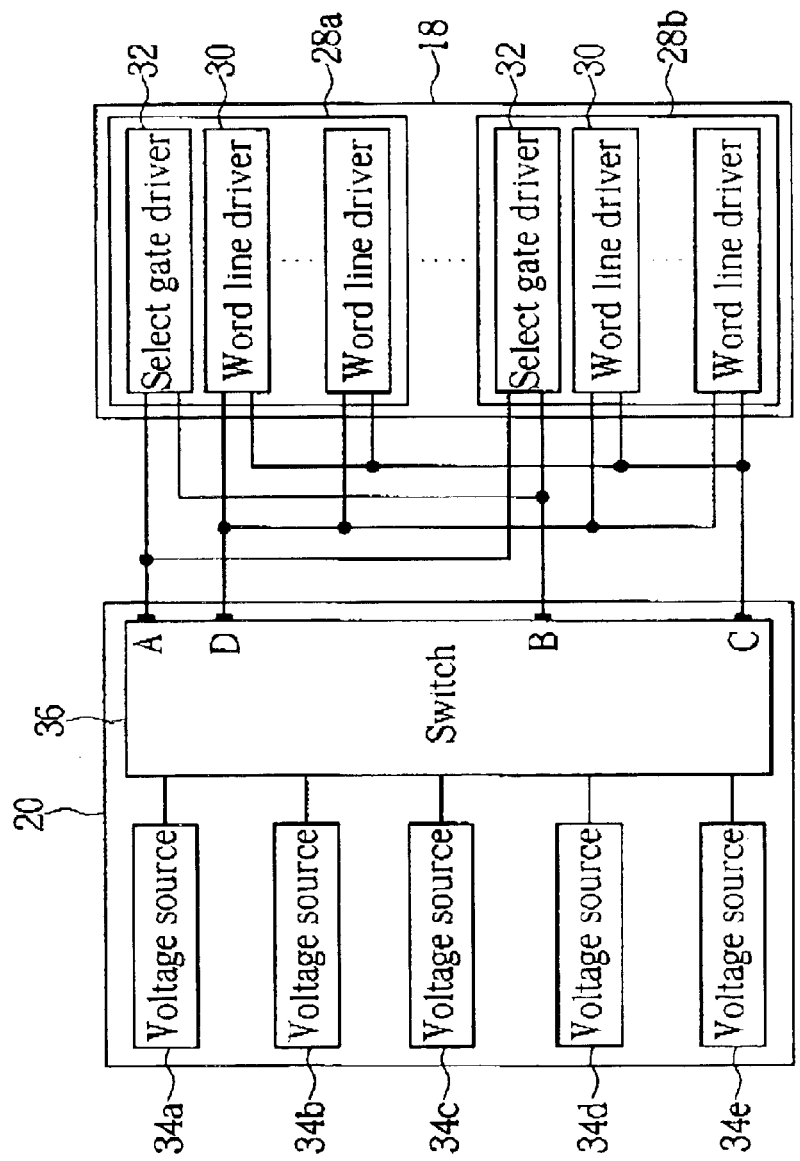
FIG. 2 is a schematic diagram of a power supply device shown in FIG. 1.
Figure 3:
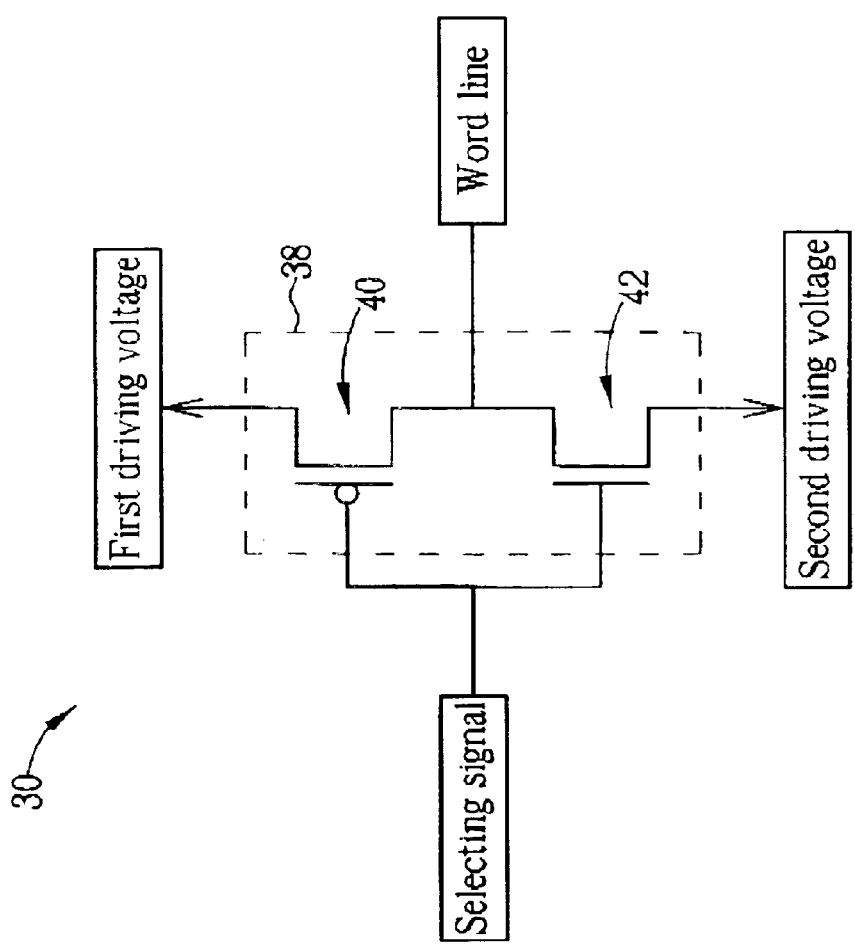
FIG. 3 is schematic diagram of a word line driver shown in FIG. 1.

As mentioned above, the driving circuit 18 generates a selecting signal according to the control signal of the controller 11. The selecting signal is used to control operation of the word line drivers 30 and the select gate driver 32 of each decoder 28. When the controller 11 intends to access the memory cells 24 positioned in the memory block 22a, the driving circuit 18 transmits the selecting signal to the decoder 28a after receiving the control signal. That is, the memory block 22a operates under the selected mode, and another decoder 28b operates under the unselected mode without receiving the selecting signal. Therefore, the decoder 28a controls the word line driver 30 to access memory cells 24 located at each word line in the memory block 22a. For example, when the memory cells 24 located at the word line N are going to be accessed, the selecting signal keeps the transistor 40 off and turns on the transistor 42. Therefore, the voltage level of the word line N will approach the second driving voltage (−10 volts), and the memory cells electrically connected to the word line N are turned on to be accessed. On the contrary, the memory cells 24 located at the other word lines remain off. The selecting signal turns on the transistor 40 and keeps the transistor 42 off. Therefore, the voltage level of the other word lines will approach the first driving voltage (0 volts) so that there is no memory cell 24 in the memory block 22b is capable of being accessed. With regard to the memory block 22b operating under the unselected mode, the power supply outputs the first driving voltage (1.5 volts) and the second driving voltage (0 volts) to the decoder 28b through the switch 54b though the decoder 28b does not receive the selecting signal. As shown in FIG. 3, the voltage difference between the first and second driving voltages necessarily generates a reverse bias for the transistor 38. However, the voltage difference is small to induce lighter junction leakage than the prior art driving circuit. In other words, the leakage current is reduced. Similarly, the voltage difference (3 volts) between the third and fourth driving voltages inputted into the select gate driver 32 is reduced to induce a smaller leakage current. To sum up, the leakage current is greatly reduced in the decoders 28 corresponding to memory blocks 22 operating under the unselected mode. Therefore, the actual driving current outputted from the decoders 28 corresponding the memory blocks 22 operating under the selected mode is not deteriorated by the undesired leakage current. The power consumption of the power supply device 50 is greatly reduced with small leakage current, and the overall driving efficiency is accordingly improved.

In contrast to the prior art power supply device, the claimed power supply device uses a plurality of switches for selectively outputting appropriate operating voltages to each decoder. Therefore, the voltage difference between a high driving voltage level and a low driving voltage level of decoders corresponding to the memory blocks operating under the unselected mode is smaller than that of decoders corresponding the memory blocks operating under the selected mode. The leakage currents generated from the decoders corresponding to the memory blocks operating under the unselected mode is greatly reduced so that the undesired power consumption is lowered and the driving efficiency related to the decoders corresponding to the memory blocks operating under the unselected mode is improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A power supply device of a flash memory for providing the flash memory with an operating voltage, the flash memory comprising a plurality of memory blocks and a plurality of decoders corresponding to the memory blocks, each memory block comprising a plurality of memory cells for storing binary data, each decoder used for selecting the memory cells out of the corresponding memory block, the power supply device comprising:

at least three voltage sources electrically connected to each decoder for outputting a plurality of voltages; and a plurality of switches each corresponding to only one of the decoders, the switch electrically connected between the voltage sources and the corresponding decoder for selectively outputting the voltages generated from the power sources to the corresponding decoder.

2. The power supply device of claim 1 wherein each of the decoders is a word line driver.

3. The power supply device of claim 2 wherein when the word line driver operates under the selected mode, the high voltage level is a grounding voltage, and the low voltage level is a negative voltage.

4. The power supply device of claim 2 wherein when the word line driver operates under the unselected mode, the high voltage level is a positive voltage, and the low voltage level is a grounding voltage.

5. The power supply device of claim 1 wherein each of the decoders is a select gate driver.

6. The power supply device of claim 5 wherein when the select gate driver operates under the selected mode, the high voltage level is a grounding voltage, and the low voltage level is a negative voltage.

7. The power supply device of claim 5 wherein when the select gate driver operates under the unselected mode, the high voltage level is a positive voltage, and the low voltage level is a grounding voltage.

* * * * *